US009827666B2

(12) United States Patent
Herzog et al.

(10) Patent No.: US 9,827,666 B2
(45) Date of Patent: *Nov. 28, 2017

(54) SERVER CONNECTIVITY CONTROL FOR A TELE-PRESENCE ROBOT

(71) Applicant: INTOUCH TECHNOLOGIES, INC., Goleta, CA (US)

(72) Inventors: John Cody Herzog, Santa Barbara, CA (US); Blair Whitney, Santa Barbara, CA (US); Yulun Wang, Goleta, CA (US); Charles S. Jordan, Santa Barbara, CA (US); Marco Pinter, Santa Barbara, CA (US)

(73) Assignee: INTOUCH TECHNOLOGIES, INC., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/829,437

(22) Filed: Aug. 18, 2015

(65) Prior Publication Data

US 2015/0352722 A1 Dec. 10, 2015

Related U.S. Application Data

(63) Continuation of application No. 12/277,922, filed on Nov. 25, 2008, now Pat. No. 9,138,891.

(51) Int. Cl.
*G05B 19/00* (2006.01)
*B25J 5/00* (2006.01)
(Continued)

(52) U.S. Cl.
CPC .............. *B25J 5/00* (2013.01); *B25J 9/1689* (2013.01); *B25J 19/023* (2013.01);
(Continued)

(58) Field of Classification Search
CPC .......... B25J 5/00; B25J 9/1689; B25J 19/023; G05D 1/0038; G05D 1/0246;
(Continued)

(56) References Cited

U.S. PATENT DOCUMENTS 5,553,609 A * 9/1996 Chen ..................... G06F 19/322
  128/904
6,292,714 B1   9/2001 Okabayashi
(Continued)

OTHER PUBLICATIONS

Extended Search Report received for European Patent Application No. 07872529.8, dated Nov. 30, 2010, 9 pages.
(Continued)

*Primary Examiner* — Mary Cheung

(57) ABSTRACT

A robot system with a robot that has a camera and a remote control station that can connect to the robot. The connection can include a plurality of privileges. The system further includes a server that controls which privileges are provided to the remote control station. The privileges may include the ability to control the robot, joint in a multi-cast session and the reception of audio/video from the robot. The privileges can be established and edited through a manager control station. The server may contain a database that defines groups of remote control station that can be connected to groups of robots. The database can be edited to vary the stations and robots within a group. The system may also allow for connectivity between a remote control station at a user programmable time window.

3 Claims, 7 Drawing Sheets

(51) Int. Cl.
*B25J 9/16* (2006.01)
*B25J 19/02* (2006.01)
*G05D 1/00* (2006.01)
*G05D 1/02* (2006.01)

(52) U.S. Cl.
CPC ......... *G05D 1/0038* (2013.01); *G05D 1/0246* (2013.01); *G05B 2219/24158* (2013.01); *G05D 1/0274* (2013.01); *G05D 2201/0206* (2013.01); *Y10S 901/01* (2013.01); *Y10S 901/47* (2013.01)

(58) Field of Classification Search
CPC .......... G05D 1/0274; G05D 2201/0206; Y10S 901/47; G10S 901/01; G05B 2219/24158
See application file for complete search history.

(56) References Cited

U.S. PATENT DOCUMENTS

| | | | |
|---|---|---|---|
| 6,411,055 B1 | 6/2002 | Fujita et al. | |
| 6,667,592 B2 | 12/2003 | Jacobs et al. | |
| 6,674,259 B1 | 1/2004 | Norman et al. | |
| 7,333,642 B2 * | 2/2008 | Green | A61B 34/76 348/E13.014 |
| 7,467,211 B1 | 12/2008 | Herman et al. | |
| 7,483,867 B2 | 1/2009 | Ansari et al. | |
| 8,612,051 B2 | 12/2013 | Norman et al. | |
| 8,726,454 B2 * | 5/2014 | Gilbert, Jr. | A47L 11/34 15/319 |
| 9,381,654 B2 | 7/2016 | Herzog et al. | |
| 2004/0260790 A1 | 12/2004 | Balloni et al. | |
| 2007/0250212 A1 * | 10/2007 | Halloran | A47L 5/30 700/245 |
| 2007/0262884 A1 * | 11/2007 | Goncalves | G01C 21/12 340/995.24 |
| 2008/0082211 A1 * | 4/2008 | Wang | A61B 34/70 700/259 |
| 2008/0263628 A1 | 10/2008 | Norman et al. | |
| 2014/0156078 A1 | 6/2014 | Herzog et al. | |
| 2016/0311114 A1 | 10/2016 | Herzog et al. | |

OTHER PUBLICATIONS

International Preliminary Report on Patentability received for PCT Patent Application No. PCT/US2009/036541, dated Oct. 28, 2010, 6 pages.
"NetMeeting", Online available at <http://web.archive.orgjweb/20060417235555/http://transcriptions.english>, Retrieved on Apr. 17, 2006, 2 pages.
Fulbright, et al., "SWAMI: An Autonomous Mobile Robot for Inspection of Nuclear Waste of Storage Facilities", Autonomous Robots, 2, 1995, pp. 225-235.
Jouppi, et al., "BiReality: Mutually-Immersive Telepresence", Multimedia '04 Proceedings of the 12th Annual ACM International Conference on Multimedia, 2004, pp. 860-867.
Notice of Allowance for U.S. Appl. No. 13/894,246, filed Mar. 4, 2016, 5 pages.

* cited by examiner

| New Group Creation | | |
|---|---|---|
| Creation Filters | | |
| OEM | AAA | ☐ |
| Customer | No Selection | ☐ |

Add Members ⟋62

| Group ⟋70 | No Selection ☐ |
|---|---|
| OEM ⟋68 | No Selection ☐ |
| Customer ⟋66 | No Selection ☐ |
| Client ⟋64 | CS-2346 ☐ |

72

| Name | AAA Executive Laptops |
|---|---|
| Members | <client>CS-2345</client><client>CS-2346</client> |
| Comments | AAA laptops used by corporate executives. |

[ Add This Goup ] ⟋74

Existing Groups ⟋76

Display Filters

| Group | No Selection ☐ |
|---|---|
| OEM | AAA ☐ |
| Customer | No Selection ☐ |
| Client | No Selection ☐ |
| Show Inactive | No Selection ☐ |

78

-60-

Time Zone
[ PST (-8) ☐ ]

80

| ID | Active | Name | Members | Created By |
|---|---|---|---|---|
| 123 [Edit] [History] 82 84 | True | AAA Proctor Boxes1 | <client>Robot-1234</client><client>Robot-1234</client><client>Robot-1234</client> | Marcus Brody 06/21/08 08:23pm |
| 125 [Edit] [History] | True | AAA Proctor Boxes1 Laptops | <client>CS-2455</client><client>CS-2455</client> | Doug Quaid 06/01/08 01:23pm |

New Rule Creation

Time Zone
PST (-8) ☐

— 92

Creation Filters

| OEM | No Selection ☐ |
|---|---|
| Customer | No Selection ☐ |

Add From ☐ :

— 96

| Group | AAA Proctor Boxes1 ☐ |
|---|---|
| OEM | No Selection ☐ |
| Customer | No Selection ☐ |
| Client | No Selection ☐ |

| From — 98 | <group>AAA Executive Laptops,/group> |
|---|---|
| To — 100 | <group>AAA Proctor Boxes1</group> |
| Priority — 102 | 1 |
| Privilege Level — 104 | Full Access ☐ |
| Type — 106 | Additive (+) ☐ |
| Bidirectional — 108 | False (=>) ☐ |
| Read-Only — 110 | False ☐ |
| Start Time — 112 | 06/20/08 08:00pm |
| End Time — 114 | 06/21/08 06:00pm |
| Comments | Temporary rule for conference demo in Georgia. |

[ Add This Rule ] — 116

Existing Rules

— 94

Display Filters

-90-

| Group | No Selection ☐ |
|---|---|
| OEM | AAA ☐ |
| Customer | No Selection ☐ |
| Client | No Selection ☐ |
| Show Inactive | No Selection ☐ |

— 118

| ID | Active | From | To | Pri | Privilege |
|---|---|---|---|---|---|
| 12<br>[Edit] 120<br>[History] ⌐122 | True | <client>CS-2556</client> | <client>Robot-1234</client> | 1 | No Save |
| 15<br>[Edit]<br>[History] | True | <customer>ISRG Customer1</customer> | <customer>ISRG Customer2</customer> | 1 | Full Access |

FIG. 4

| Control Station | Customer | Location | Robot | Customer | Location |
|---|---|---|---|---|---|
| CS-2015 ▽ | North Shore Long Island Jewish | North Shore: Dr. Kavoussi Office | Robot-1103 ▽ | Intensive Care On-line Network, Inc. | ICON |

132 — 134 — -130-

Connectivity failure detected. Select an option below to resolve key problem.

Allow CS-2015 to connect to Robot-1103.... ▽  for 2 days ▽   [GO]

Owner: Cody Herzog
Comments: Temp rule for demo

Rule Trace:
No applicable rules found.

FIG. 5

| Control Station | Customer | Location | Robot | Customer | Location |
|---|---|---|---|---|---|
| CS-2009 ▽ | ITH | ITH | Robot-1094 ▽ | AAA | AAA |

132 — 134 — -130-

Connectivity success. No key problems.

Rule Trace: [Edit applicable rules]
:  <customer>ITH</customer> TO <group>%all%</group>,Full Access

SERVER CONNECTIVITY CONTROL FOR A TELE-PRESENCE ROBOT

BACKGROUND OF THE INVENTION

1. Field of the Invention

The subject matter disclosed generally relates to the field of robotics.

2. Background Information

Robots have been used in a variety of applications ranging from remote control of hazardous material to assisting in the performance of surgery. For example, U.S. Pat. No. 5,762,458 issued to Wang et al. discloses a system that allows a surgeon to perform minimally invasive medical procedures through the use of robotically controlled instruments. One of the robotic arms in the Wang system moves an endoscope that has a camera. The camera allows a surgeon to view a surgical area of a patient.

There has been marketed a tele-presence mobile robot introduced by InTouch Technologies, Inc., the assignee of this application, under the trademark RP-7. The InTouch robot is controlled by a user at a remote station. The remote station may be a personal computer with a joystick that allows the user to remotely control the movement of the robot. Both the robot and remote station have cameras, monitors, speakers and microphones to allow for two-way video/audio communication. The robot camera provides video images to a screen at the remote station so that the user can view the robot's surroundings and move the robot accordingly.

The InTouch robot system can be used to access any number of robots from different remote locations. For example, a hospital facility may have a number of tele-presence robots that are accessible from different remote computer stations. A physician can become connected to a robot by merely logging on through a laptop or personal computer. As the number of in-field InTouch tele-presence robots grows, it is desirable to set and edit the connectivity between various remote control stations and different robots. It is also desirable to provide a means to control the parameters of the connectivity. For example, it may be desirable to control connectivity so that multiple remote control stations can receive the audio/video provided by the robot. It may be desirable to restrict the audio and/or video provided to one or more remote control stations. It may also be desirable to establish a time window of connectivity between control stations and robots.

BRIEF SUMMARY OF THE INVENTION

A robot system with a robot that has a camera and a remote control station that can connect to the robot. The connection can include a plurality of privileges. The system further includes a server that controls which privileges are provided to the remote control station. The system may include a manager control station that can access said server to establish and edit said privileges.

BRIEF DESCRIPTION OF THE DRAWINGS

FIG. 2 is an illustration of a user interface to create connectivity groups;

FIG. 3 is an illustration of a user interface to create connectivity rules;

FIG. 4 is an illustration of a user interface used to test connectivity between a remote control station and a robot;

FIG. 5 is an illustration of a user interface similar to FIG. 4 showing an error message;

DETAILED DESCRIPTION

Disclosed is a robot system with a robot that has a camera and a remote control station that can connect to the robot. The connection can include a plurality of privileges. The system further includes a server that controls which privileges are provided to the remote control station. The privileges may include the ability to control the robot, join in a multi-cast session and the reception of audio/video from the robot. The privileges can be established and edited through a manager control station. The server may contain a database that defines groups of remote control stations that can be connected to groups of robots. The database can be edited to vary the stations and robots within a group. The system may also allow for connectivity between a remote control station and a robot within a user programmable time window. The system may also allow for connectivity between arbitrary endpoints, including control station to control station connections and robot to robot connections.

Figure 1:
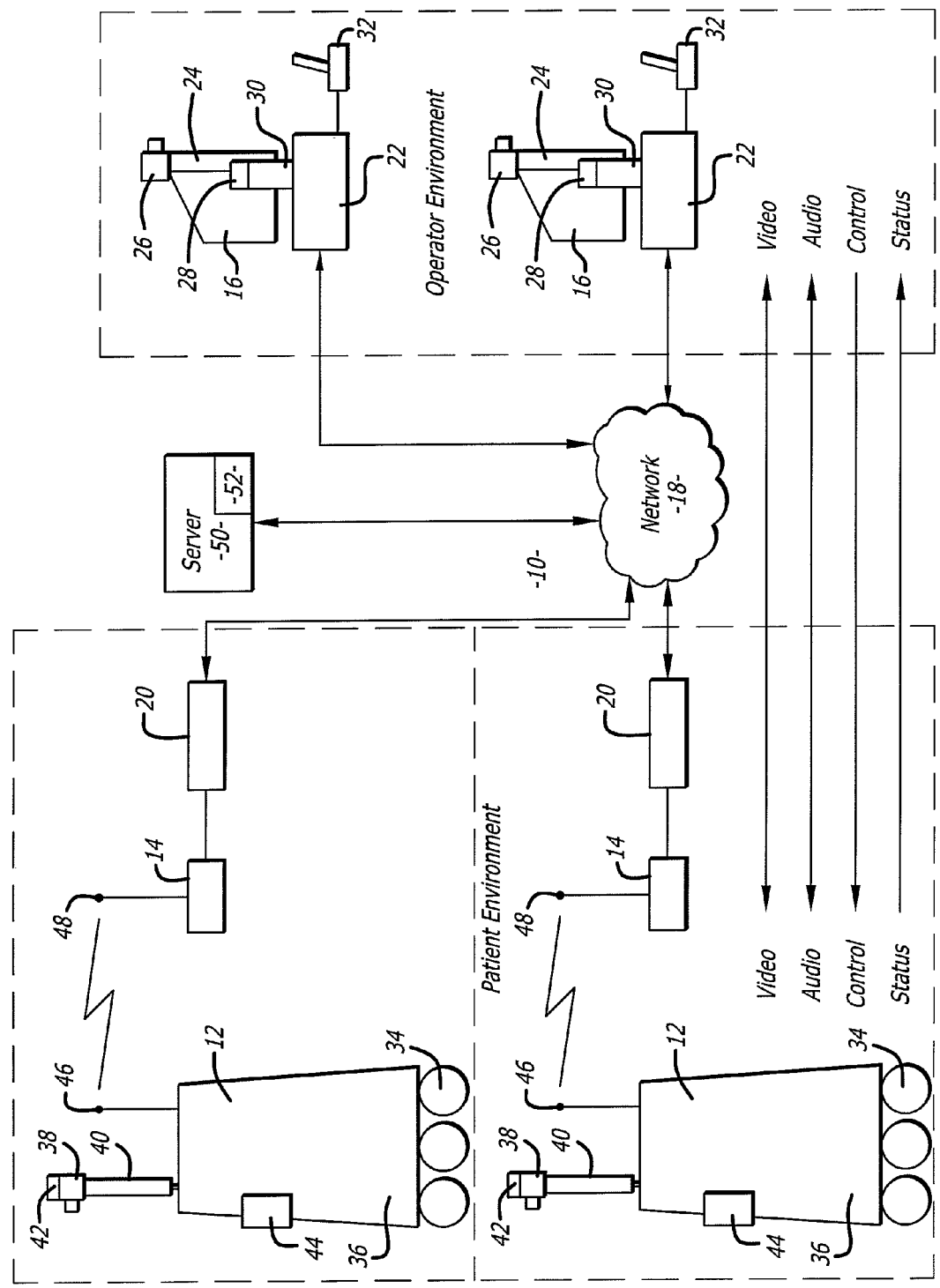
FIG. 1 is an illustration of a robotic system.

Referring to the drawings more particularly by reference numbers, FIG. 1 shows an embodiment of a robot system 10. The robot system 10 includes a plurality of robots 12 each with a base station 14 and a plurality of remote control stations 16. Each remote control station 16 may be coupled to the base station 14 through a network 18. By way of example, the network 18 may be either a packet switched network such as the Internet, or a circuit switched network such has a Public Switched Telephone Network (PSTN) or other broadband system. The base station 14 may be coupled to the network 18 by a modem 20 or other broadband network interface device.

Each remote control station 16 may include a computer 22 that has a monitor 24, a camera 26, a microphone 28 and a speaker 30. The computer 22 may also contain an input device 32 such as a joystick or a mouse. Each control station 16 is typically located in a place that is remote from the robot 12. Although only one robot 12 is shown, it is to be understood that the system 10 may have a plurality of robots 12. In general any number of robots 12 may be controlled by any number of remote stations. For example, one remote station 16 may be coupled to a plurality of robots 12, or one robot 12 may be coupled to a plurality of remote stations 16.

The robot 12 includes a movement platform 34 that is attached to a robot housing 36. Also attached to the robot housing 36 are a camera 38, a monitor 40, a microphone(s) 42 and a speaker 44. The microphone 42 and speaker 30 may create a stereophonic sound. The robot 12 may also have an antenna 46 that is wirelessly coupled to an antenna 48 of the base station 14. The system 10 allows a user at the remote control station 16 to move the robot 12 through the input device 32. The robot camera 38 is coupled to the remote monitor 24 so that a user at the remote station 16 can view a patient. Likewise, the robot monitor 40 is coupled to the remote camera 26 so that the patient can view the user. The microphones 28 and 42, and speakers 30 and 44, allow for audible communication between the patient and the user.

Each remote station computer 22 may operate Microsoft OS software and WINDOWS XP or other operating systems such as LINUX. The remote computer 22 may also operate a video driver, a camera driver, an audio driver and a joystick driver. The video images may be transmitted and received with compression software such as MPEG CODEC. The control station may have general user interfaces that allow for operation of a robot and for multi-casting with other remote stations.

The system 10 includes a server 50 that controls connectivity between the remote control stations 16 and the robots 12. The server 50 includes a database 52. By way of example, the database 52 may be a relational database. The database 52 can allow for groups of remote stations to connect groups of robots. Groups may contain individual robots and control stations. Groups may also contain customers, which represent all robots and control stations belonging to a particular customer. Groups may also contain OEM configurations, which represent all robots and control stations that are sold by a particular 3rd-party OEM distributor. Groups may also contain other groups in a recursive fashion. By way of example, one healthcare entity may have three robots designated ROBOT-1, ROBOT-2 and ROBOT-3 and 5 remote stations designated CS-1, CS-2, CS-3, CS-4 and CS-5. The 3 robots are defined as group R and the remote stations are defined as group S. Rules can be established that allow connectivity between any remote station in group S with any robot in group R.

FIG. 2 shows a user interface 60 that can be used to create and edit groups. The interface includes an "Add Members" field 62 that allows a user to add members to a group. The members can be selected through the "Clients" field 64, "Customers" field 66, "OEM" configuration field 68 or by a "Group" name field 70. The members of the new group are listed in the "Members" field 72. The members can be listed as a string of client serial numbers, customer ids, OEM configuration ids and group ids in a simple XML-like format. In this example, the group includes client control stations CS-2345 and CS-2346. The interface 60 may include an "Add This Group" button 74 that can be selected to add a group to the database.

The interface 60 may include an "Existing Groups" area 76 that allows the user to view existing groups and group members through fields 78 which filter based on the category of group name, OEM, customer or client. Interface area 80 lists each group along with the group members, the person who created the group (with time log), and an indication of whether the group is active. An existing group can be edited by selecting an "Edit" button 82. A history of edits can be viewed by selecting the "History" button 84.

The group data may be stored in the database with the following group connectivity information:
id [int, identity]: Unique numeric ID.
createID [int]: ID that is shared amongst all group edits in the history chain. This is used to locate the group history. For the initial group creation, the createID is equal to the regular id. All subsequent edits to the group will retain the same createID, but will be given new unique regular ids.
isActive[bit]: Set to true if group is currently considered active, meaning that it has not been edited and replaced by a new version of the group.
name [nvarchar]: Friendly name of group. This name appears in any group dropdowns in an advanced page.
members [text]: String of group members. Contains mixed client machines, customer names, OEM configurations and nested groups.
membersExpanded [text]: Stores members in an expanded format where all nested groups and OEMs are expanded to list all client machines and customers contained in the groups.
createdUTC[int]: Timestamp of initial group creation in UTC seconds. When a group is edited, the original group becomes inactive and a new group is created, but the createdUTC timestamp is maintained in the new group.
modifiedUTC[int]: Timestamp of most recent group modification in UTC seconds. For groups being made inactive due to a group edit, the newly inactive group will have its modified timestamp set to the time of the edit.
creator[nvarchar]: The user who first created the group. This can be automatically pulled from domain login credentials used to access the various UI pages.
lastModifiedBy[nvarchar]: The user who last modified the group. This can be automatically pulled from domain login credentials used to access the various UI pages.
comments[text]: Textual comments attached to group.

FIG. 3 is an interface 90 that can be used to create and edit connectivity rules. The interface 90 includes rule creation filter fields 92 that allow a user to filter the list of systems that appear in the client field XX when creating new rules. There are also fields 94 that allow the user to review existing rules. The connectivity path of a rule can be defined in fields 96 by adding groups, OEMs, customers, and individual robots and control stations to the "From" 98 and "To" 100 fields.

The rules include "From" 98 and "To" 100 fields that define the connectivity path between control stations and robots. The "Priority" field 102 defines how conflicting rules will be resolved. When rules are in conflict, the priority value resolves the ambiguity. If two conflicting rules have the same priority, the rule that was modified most recently wins. The "Privilege Level" field 104 establishes what privileges are allowed in this particular connectivity. By way of example, the system may allow the following privileges:
The ability to operate the robot.
The ability to accept multi-cast sessions with one or more other remote control stations.
The ability to be the Host (primary control station CS user) for a multi-cast session with one or more other remote control stations.
The ability to be a Guest CS in a multi-cast session with one or more other remote control stations.
The ability to connect directly to a robot (i.e. without being a Guest).
Disabling of all visible video output and/or audio output from the robot.
Disabling of saving of media including snapshots and movies from the robot.
Access to a medical device connected to the robot.
The ability to view and control auxiliary video sources.
The ability to use an external handset attached to the robot.

The "Type" field 106 allows the user to specify whether the rule is additive or subtractive. Additive rules can be used to add connectivity. Subtractive rules can be used to selectively remove connectivity in a targeted manner. The "Bidirectional" field 108 allows for connectivity between the From and To members to be unidirectional ("False") or bidirectional ("True") which is selectable by the user. The user can set the rule as read-only in the "Read-Only" field 110. Read-only rules always appear at the top of the list when rules are displayed. They require special double confirmation to be edited or deleted.

The user can select a time window for connectivity by entering a start date and time in a "Start Time" field 112 and an end date and time in an "End Time" field 114. The rule can be added by selecting the "Add This Rule" button 116. This allows a user to schedule connectivity in advance, to be enabled at a later date and time.

The From, To, Priority, Privilege and Active data for existing rules can be displayed in an interface area 118. A user can edit an existing rule by selecting an "Edit" button 120 and review edit history by selecting a "History" button 122.

The rules can be stored in the relational database with the following connectivity rule information:

id [int, identity]: Unique numeric ID.

createID [int]: ID that is shared amongst all rules in the history chain that resulted from edits. This is used to locate the rule history. For the initial rule, the createID is equal to the regular id. All subsequent edits to the rule will retain the same createID, but will be given new unique regular ids.

priority [int]: Allows establishing precedence between conflicting rules by determining the order in which rules are applied. Higher numbers means the rule will be applied later in the logic chain.

groupFrom [text]: String of "from" group members. Contains mixed client machines, customers and groups. For non-bidirectional rules, this represents the source of connectivity, for bidirectional rules it represents both source and destination.

groupTo [text]: String of "to" group members. Contains mixed client machines, customers and groups. For non-bidirectional rules, this represents the destination of connectivity, for bidirectional rules it represents both source and destination.

groupFromExpanded [text]: Stores groupFrom in an expanded format where all nested groups and OEMs are expanded to list all client machines and customers contained in the groups.

groupToExpanded [text]: Stores groupTo in an expanded format where all nested groups and OEMs are expanded to list all client machines and customers contained in the groups.

privilegeMaskFriendlyNameID [int]: Sets the privilege mask associated with this connectivity rule. This is a link to a privilege table. This can also be set to the special value of −1, which implies that the privilege is not explicitly defined and will be inherited from a rule that is higher up in the logic chain. The privilege table can be transferred to a control station which includes code that can decode the table to determine which privileges are allowed in a connectivity.

isActive[bit]: Set to true if rule is currently considered active, meaning that it has not expired and has not explicitly been removed or deactivated as the result of being replaced by a new version of the rule following an edit.

isBidirectional[bit]: Set to true if rule is bidirectional, meaning that "from" can connect to "to" and vice versa. Set to false for one-way, "from"→"to" connectivity.

isReadOnly[bit]: Set to true if the rule is read only, meaning that it requires double confirmation on edit/delete and always appears at top of rule list display. Set to false for standard rule.

type[int]: 0=additive connectivity rule, 1=subtractive connectivity rule, 2=privilege-only rule startUTC[int]: Defines the start of time window that rule is active in UTC seconds.

endUTC[int]: Defines the end of time window that rule is active in UTC seconds. For infinite rules, this will be set to 0.

createdUTC[int]: Timestamp of initial rule creation in UTC seconds. When a rule is edited, the original rule becomes inactive and a new rule is created, but the createdUTC timestamp is maintained in the new rule.

modifiedUTC[int]: Timestamp of most recent rule modification in UTC seconds. For rules being made inactive due to a rule edit, the newly inactive rule will have its modified timestamp set to the time of the edit.

creator[nvarchar]: The user who first created the rule. This can be automatically pulled from domain login credentials used to access the various UI pages.

lastModifiedBy[nvarchar]: The user who last modified the rule. This can be automatically pulled from domain login credentials used to access the various UI pages.

comments[text]: Textual comments attached to rule. These are required.

The ability to change/add groups and rules can be limited to a select field of users, requiring a password/code for access to the interfaces 60 and 90. The server 50 may provide interfaces that can be accessed by the remote control stations 16 to review connectivity. The pages can provide information on which robots can be accessed by a particular remote control station or which remote control stations can access a specific robot.

The server may provide a tester page that allows a user to test the connectivity between two endpoints. FIG. 4 shows an interface 130 that can be used to test connectivity. The interface 130 includes a "Control Station" field 132 that allows a user to enter a control station name and a "Robot" field 134 that allows the user to enter a robot name. If connectivity is allowed by the server 50 then the interface may indicate a successful connection as in FIG. 5. If connectivity is not allowed by the server 50 then the interface may display a message as shown in FIG. 4. In either case, the interface may display the list of all connectivity rules that applied to the calculation of the connectivity success or failure.

Figure 6:
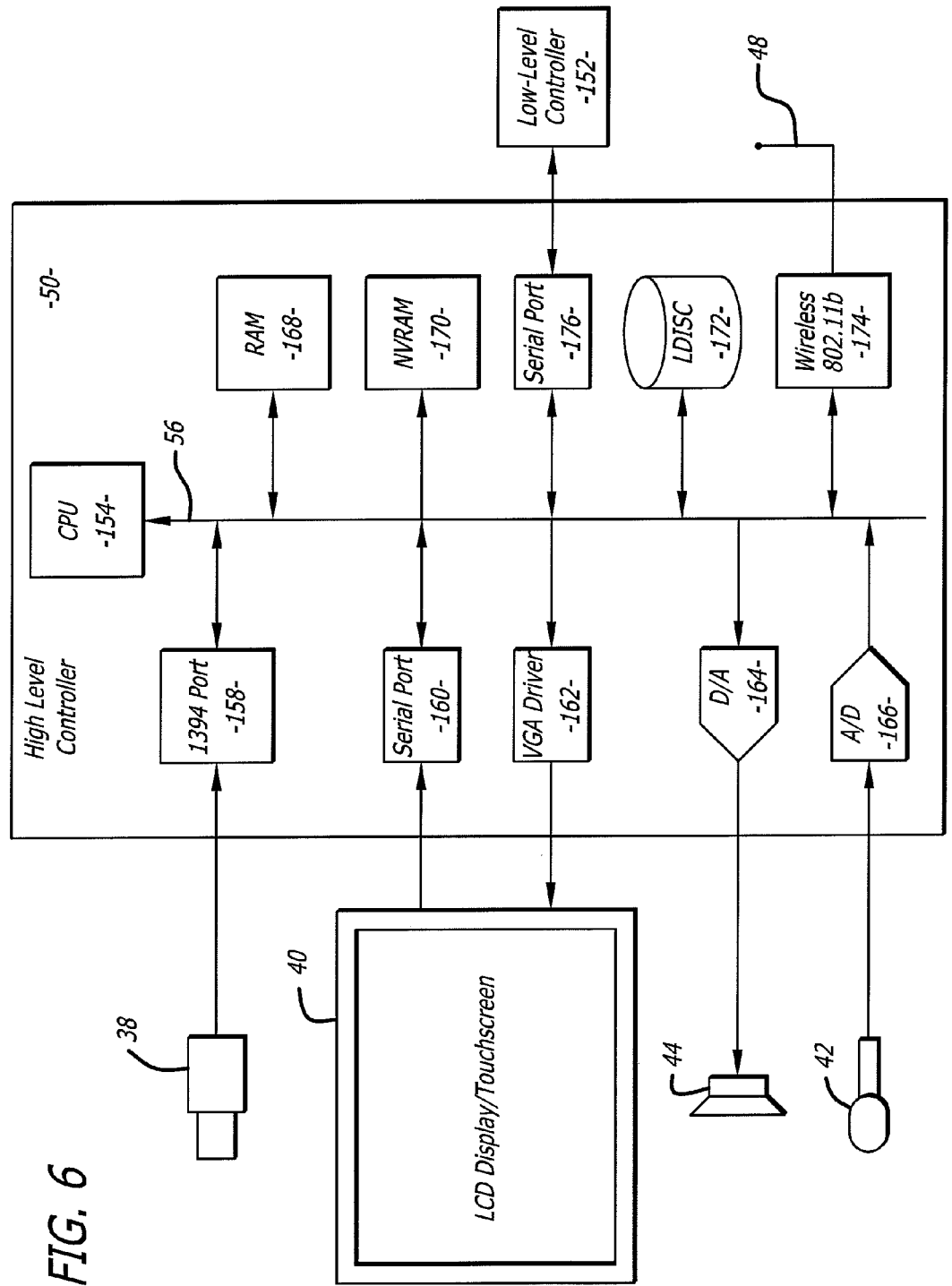
FIG. 6 is a schematic of an electrical system of a robot.

FIG. 6 shows an embodiment of the robot 12. The robot 12 may include a high level control system 150 and a low level control system 152. The high level control system 150 may include a processor 154 that is connected to a bus 156. The bus is coupled to the camera 138 by an input/output (I/O) port 158, and to the monitor 140 by a serial output port 160 and a VGA driver 162. The monitor 40 may include a touchscreen function that allows the patient to enter input by touching the monitor screen.

The speaker 44 is coupled to the bus 156 by a digital to analog converter 164. The microphone 42 is coupled to the bus 156 by an analog to digital converter 166. The high level controller 150 may also contain random access memory (RAM) device 168, a non-volatile RAM device 170 and a mass storage device 172 that are all coupled to the bus 162. The mass storage device 172 may contain medical files of the patient that can be accessed by the user at the remote control station 16. For example, the mass storage device 172 may contain a picture of the patient. The user, particularly a health care provider, can recall the old picture and make a side by side comparison on the monitor 24 with a present video image of the patient provided by the camera 38. The robot antennae 46 may be coupled to a wireless transceiver 174. By way of example, the transceiver 174 may transmit and receive information in accordance with IEEE 802.11b.

The controller 154 may operate with a LINUX OS operating system. The controller 154 may also operate MS WINDOWS along with video, camera and audio drivers for communication with the remote control station 16. Video information may be transceived using MPEG CODEC compression techniques. The software may allow the user to send e-mail to the patient and vice versa, or allow the patient to access the Internet. In general the high level controller 150 operates to control the communication between the robot 12 and the remote control station 16. The controller and the high level controller 150 may be linked to the low level controller 152 by serial ports 176.

The low level controller 152 runs software routines that mechanically actuate the robot 12. For example, the low level controller 152 provides instructions to actuate the movement platform to move the robot 12. The low level controller 152 may receive movement instructions from the high level controller 150. The movement instructions may be received as movement commands from the remote control station. Although two controllers are shown, it is to be understood that the robot 12 may have one controller controlling the high and low level functions.

Figure 7:
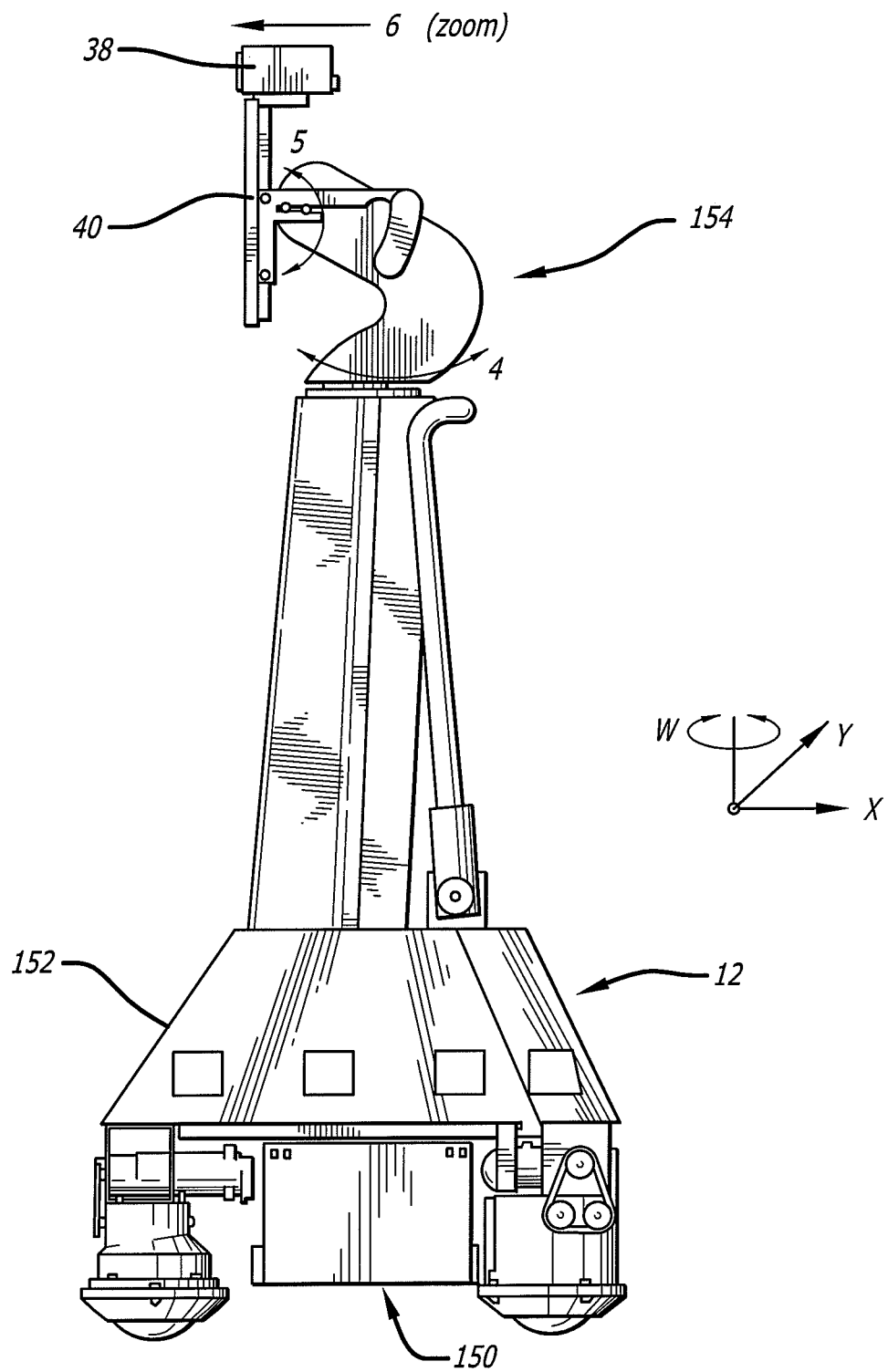
FIG. 7 is side view of the robot.

FIG. 7 shows an embodiment of the robot 12. The robot 12 may include a holonomic platform 150 that is attached to a robot housing 152. The holonomic platform 150 provides three degrees of freedom to allow the robot 12 to move in any direction.

The robot 12 may have a head 154 that supports the camera 38 and the monitor 40. The head 154 may have two degrees of freedom so that the camera 26 and monitor 24 can be swiveled and pivoted as indicated by the arrows.

The system may be the same or similar to a robotic system provided by the assignee InTouch-Health, Inc. of Santa Barbara, Calif. under the trademark RP-7. The system may also be the same or similar to the system disclosed in U.S. Pat. No. 6,925,357 issued Aug. 2, 2005, which is hereby incorporated by reference.

In operation, the robot 12 may be placed in a home, public or commercial property, or a facility where one or more patients are to be monitored and/or assisted. The facility may be a hospital or a residential care facility. By way of example, the robot 12 may be placed in a home where a health care provider may monitor and/or assist the patient. Likewise, a friend or family member may communicate with the patient. The cameras and monitors at both the robot and remote control stations allow for teleconferencing between the patient and the person at the remote station(s).

The robot 12 can be maneuvered through the home, property or facility by manipulating the input device 32 at a remote station 16.

The robot 10 may be controlled by a number of different users. To accommodate for this the robot may have an arbitration system. The arbitration system may be integrated into the operating system of the robot 12. For example, the arbitration technique may be embedded into the operating system of the high-level controller 150.

By way of example, the users may be divided into classes that include the robot itself, a local user, a caregiver, a doctor, a family member, or a service provider. The robot 12 may override input commands that conflict with robot operation. For example, if the robot runs into a wall, the system may ignore all additional commands to continue in the direction of the wall. A local user is a person who is physically present with the robot. The robot could have an input device that allows local operation. For example, the robot may incorporate a voice recognition system that receives and interprets audible commands.

A caregiver is someone who remotely monitors the patient. A doctor is a medical professional who can remotely control the robot and also access medical files contained in the robot memory. The family and service users remotely access the robot. The service user may service the system such as by upgrading software, or setting operational parameters.

Message packets may be transmitted between a robot 12 and a remote station 16. The packets provide commands and feedback. Each packet may have multiple fields. By way of example, a packet may include an ID field a forward speed field, an angular speed field, a stop field, a bumper field, a sensor range field, a configuration field, a text field and a debug field.

The identification of remote users can be set in an ID field of the information that is transmitted from the remote control station 16 to the robot 12. For example, a user may enter a user ID into a setup table in the application software run by the remote control station 16. The user ID is then sent with each message transmitted to the robot.

The robot 12 may operate in one of two different modes; an exclusive mode, or a sharing mode. In the exclusive mode only one user has access control of the robot. The exclusive mode may have a priority assigned to each type of user. By way of example, the priority may be in order of local, doctor, caregiver, family and then service user. In the sharing mode two or more users may share access with the robot. For example, a caregiver may have access to the robot, the caregiver may then enter the sharing mode to allow a doctor to also access the robot. Both the caregiver and the doctor can conduct a simultaneous tele-conference with the patient.

The arbitration scheme may have one of four mechanisms; notification, timeouts, queue and call back. The notification mechanism may inform either a present user or a requesting user that another user has, or wants, access to the robot. The timeout mechanism gives certain types of users a prescribed amount of time to finish access to the robot. The queue mechanism is an orderly waiting list for access to the robot. The call back mechanism informs a user that the robot can be accessed. By way of example, a family user may receive an e-mail message that the robot is free for usage. Tables 1 and 2, show how the mechanisms resolve access request from the various users.

TABLE I

| User | Access Control | Medical Record | Command Override | Software/Debug Access | Set Priority |
| --- | --- | --- | --- | --- | --- |
| Robot | No | No | Yes (1) | No | No |
| Local | No | No | Yes (2) | No | No |
| Caregiver | Yes | Yes | Yes (3) | No | No |
| Doctor | No | Yes | No | No | No |
| Family | No | No | No | No | No |
| Service | Yes | No | Yes | Yes | Yes |

TABLE II

| | | Requesting User | | | | |
| --- | --- | --- | --- | --- | --- | --- |
| | | Local | Caregiver | Doctor | Family | Service |
| Current User | Local | Not Allowed | Warn current user of pending user | Warn current user of pending user | Warn current user of pending user | Warn current user of pending user |

TABLE II-continued

| | | Requesting User | | | |
|---|---|---|---|---|---|
| | Local | Caregiver | Doctor | Family | Service |
| | | Notify requesting user that system is in use Set timeout | Notify requesting user that system is in use Set timeout = 5 m | Notify requesting user that system is in use Set timeout = 5 m Call back | Notify requesting user that system is in use No timeout Call back |
| Caregiver | Warn current user of pending user. Notify requesting user that system is in use. Release control | Not Allowed | Warn current user of pending user Notify requesting user that system is in use Set timeout = 5 m Queue or callback | Warn current user of pending user Notify requesting user that system is in use Set timeout = 5 m | Warn current user of pending user Notify requesting user that system is in use No timeout Callback |
| Doctor | Warn current user of pending user Notify requesting user that system is in use Release control | Warn current user of pending user Notify requesting user that system is in use Set timeout = 5 m | Warn current user of pending user Notify requesting user that system is in use No timeout Callback | Notify requesting user that system is in use No timeout Queue or callback | Warn current user of pending user Notify requesting user that system is in use No timeout Callback |
| Family | Warn current user of pending user Notify requesting user that system is in use Release Control | Notify requesting user that system is in use No timeout Put in queue or callback | Warn current user of pending user Notify requesting user that system is in use Set timeout = 1 m | Warn current user of pending user Notify requesting user that system is in use Set timeout = 5 m Queue or callback | Warn current user of pending user Notify requesting user that system is in use No timeout Callback |
| Service | Warn current user of pending user Notify requesting user that system is in use No timeout | Notify requesting user that system is in use No timeout Callback | Warn current user of request Notify requesting user that system is in use No timeout Callback | Warn current user of pending user Notify requesting user that system is in use No timeout Queue or callback | Not Allowed |

The information transmitted between the station 16 and the robot 12 may be encrypted. Additionally, the user may have to enter a password to enter the system 10. A selected robot is then given an electronic key by the station 16. The robot 12 validates the key and returns another key to the station 16. The keys are used to encrypt information transmitted in the session.

Figure 8:
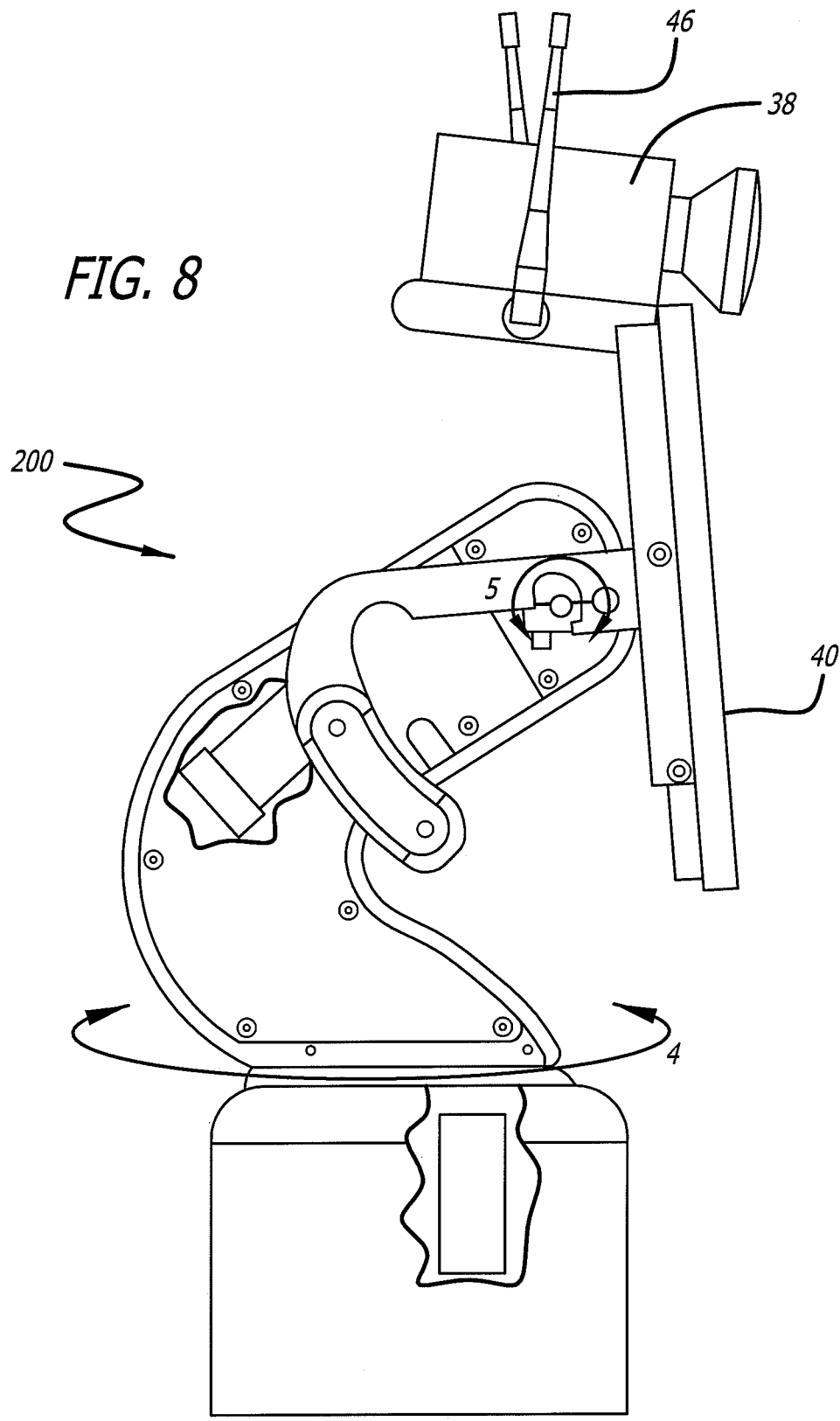
FIG. 8 is a side view of a robot head.

FIG. 8 shows a robot head 200 that can both pivot and spin the camera 38 and the monitor 40. The robot head 200 can be similar to the robot 12 but without the platform 110. The robot head 200 may have the same mechanisms and parts to both pivot the camera 38 and monitor 40 about a pivot axis 4, and spin the camera 38 and monitor 40 about a spin axis 5. The pivot axis may intersect the spin axis. Having a robot head 200 that both pivots and spins provides a wide viewing area. The robot head 200 may be in the system either with or instead of the mobile robot 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A remote controlled robot system comprising:
    a robot that has a robot camera and a robot monitor;
    a remote control station that has a station camera and a station monitor and can connect to and control a motion of said robot; and,
    a server that controls connectivity between said remote control station and said robot in accordance with one or more connectivity rules, wherein said server includes a user interface that can be accessed by a user to modify said one or more connectivity rules and, when said robot and said remote control station are connected, said robot monitor displays an image captured by said station camera and said station monitor displays an image captured by said robot camera.

2. The system of claim 1, wherein modifying said one or more connectivity rules includes one of editing an existing rule and adding a new rule.

3. The system of claim 2, wherein said robot includes a mobile platform.

* * * * *